(12) United States Patent
Okada et al.

(10) Patent No.: US 8,539,668 B2
(45) Date of Patent: Sep. 24, 2013

(54) APPARATUS FOR MANUFACTURING TEMPORARY SUBSTRATE

(75) Inventors: Takeshi Okada, Nagano (JP); Kazuhiro Kobayashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 70 days.

(21) Appl. No.: 13/115,287

(22) Filed: May 25, 2011

(65) Prior Publication Data

US 2011/0289770 A1    Dec. 1, 2011

(30) Foreign Application Priority Data

May 28, 2010   (JP) .................................. 2010-122307

(51) Int. Cl.
*B23P 19/00* (2006.01)
(52) U.S. Cl.
USPC .............................................. 29/738; 29/729
(58) Field of Classification Search
USPC ................................................... 29/729, 738
See application file for complete search history.

(56) References Cited

U.S. PATENT DOCUMENTS

| | | | | |
|---|---|---|---|---|
| 7,222,421 B2* | 5/2007 | Nakamura | ...................... | 29/830 |
| 7,716,826 B2* | 5/2010 | Nakamura | ...................... | 29/846 |
| 2005/0155222 A1* | 7/2005 | Nakamura | ...................... | 29/830 |
| 2007/0124924 A1* | 6/2007 | Nakamura | ...................... | 29/830 |
| 2011/0289770 A1* | 12/2011 | Okada et al. | ................... | 29/829 |

FOREIGN PATENT DOCUMENTS

JP      2007-158174 A1      6/2007

\* cited by examiner

*Primary Examiner* — Carl Arbes
(74) *Attorney, Agent, or Firm* — Kratz, Quintos & Hanson, LLP

(57) ABSTRACT

An apparatus for manufacturing a temporary substrate includes a jig having a table, a holding guide for positioning constituent members of the temporary substrate, a holding unit for holding the laminated constituent members, and a heater unit for performing a temporary bonding on the laminated constituent members, and further includes a drive mechanism for moving each member constituting the jig between a standby position and an in-use position. The holding guide has a plurality of step portions formed in such a manner that peripheries of the step portions define areas corresponding to outer sizes of the respective constituent members when the holding guide is moved to the in-use position. The temporary substrate has as the constituent members, a prepreg, inner metal foils respectively stacked on both surfaces of the prepreg and each having a smaller outer size than the prepreg, and outer metal foils respectively stacked on the inner metal foils and each having a larger outer size than the prepreg.

6 Claims, 15 Drawing Sheets

FIG. 5A    STANDBY POSITION
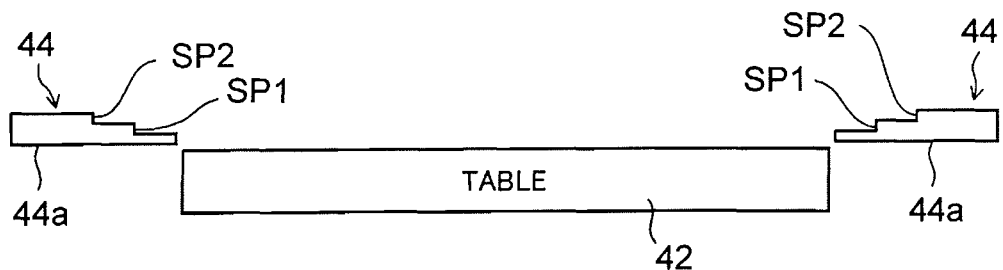
FIG. 5B    GUIDED POSITION
WHEN INNER COPPER FOIL IS POSITIONED
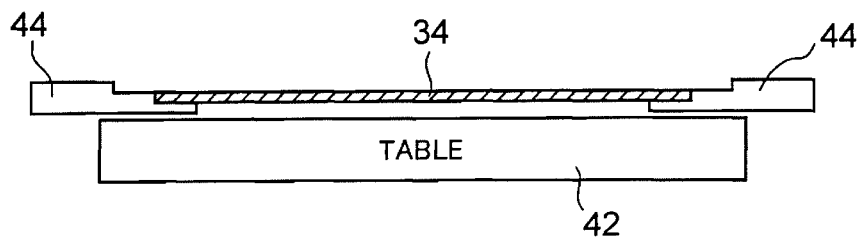
WHEN PREPREG IS POSITIONED
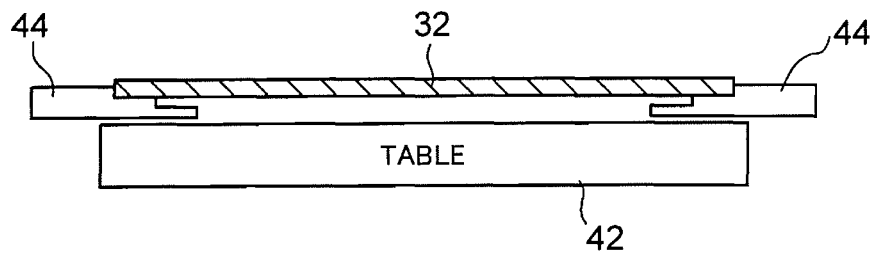

APPARATUS FOR MANUFACTURING TEMPORARY SUBSTRATE

CROSS-REFERENCE TO RELATED APPLICATION

This application is based upon and claims the benefit of priority of the prior Japanese Patent Application No. 2010-122307, filed on May 28, 2010, the entire contents of which are incorporated herein by reference.

FIELD

The embodiments discussed herein are related to an apparatus for and a method of manufacturing a temporary substrate used as a support in manufacturing a multilayer wiring board.

BACKGROUND

As a technique of manufacturing a wiring board of a multilayer structure (hereinafter, also referred to as a "package" for convenience), a build-up process has been widely used. In the structure of a multilayer wiring board manufactured using the build-up process, its core substrate is required to have such a thickness that the package can have stiffness. This imposes a limitation on manufacturing a thin package as a whole.

In recent years, a structure from which a core substrate is removed has been employed in order to manufacture a thinner package. The wiring board having such a structure is also called a "coreless board" meaning having no core portion. Patent document 1 (Japanese Laid-open Patent Publication No. 2007-158174) describes an example of the process of manufacturing such a coreless board. The process includes forming a pad on a temporary substrate serving as a support, sequentially forming build-up layers (insulating layers, wiring layers) on the pad and the temporary substrate, and finally removing the temporary substrate.

Such a temporary substrate has, as constituent members thereof, for example, a prepreg, metal foils (hereinafter, referred to as "inner metal foils") respectively stacked on both surfaces of the prepreg and each having an outer size smaller than the prepreg, and metal foils (hereinafter, referred to as "outer metal foils") respectively stacked on both surfaces of the inner metal foils and each having an outer size larger than the prepreg.

In the process for a multilayer wiring board (coreless board) using a temporary substrate, a bonded portion in an outer peripheral portion of the temporary substrate is cut out and removed, and thus the inside of the bonded portion defines a wiring formation area. Accordingly, in order to secure the largest possible wiring formation area, the inner metal foils have to be disposed with high precision, and the bonded portion has to be cut out accurately at positions corresponding to the peripheries of the inner metal foils (i.e., the bonded portion to be removed has to be minimum).

However, the state of the art is such that in the process of manufacturing a temporary substrate, effective means for positioning an inner metal foil with high precision has not yet been found.

SUMMARY

According to one aspect of the invention, there is provided an apparatus for manufacturing a temporary substrate, including: a jig including a table for laminating constituent members of the temporary substrate, a holding guide for guiding one of the constituent members to a predetermined position, a holding unit for holding the laminated constituent members, and a heater unit for performing a temporary bonding on the laminated constituent members; and a drive mechanism for moving each of the holding guide, the holding unit and the heater unit between a standby position and an in-use position, wherein the holding guide has a plurality of step portions formed in such a manner that peripheries of the step portions define areas corresponding to outer sizes of the respective constituent members when the holding guide is moved to the in-use position.

According to another aspect of the invention, there is provided a method of manufacturing a temporary substrate using a jig including a table, a holding guide, a holding unit and a heater unit, the method including: setting a first outer metal foil on the table, and moving the holding guide to hold and fix the first outer metal foil with a bottom surface of the holding guide; setting a first inner metal foil on the first outer metal foil in accordance with a first step portion of the holding guide, moving the holding unit to hold the first inner metal foil, and then moving the holding guide to a standby position; moving the holding guide to hold and fix the first inner metal foil with the bottom surface of the holding guide, and then moving the holding unit to a standby position; setting a prepreg on the first inner metal foil in accordance with a second step portion of the holding guide, moving the holding unit to hold the prepreg, and then moving the holding guide to the standby position; moving the holding guide to hold and fix the prepreg with the bottom surface of the holding guide, and then moving the holding unit to the standby position; setting a second inner metal foil on the prepreg in accordance with the first step portion of the holding guide, moving the holding unit to hold the second inner metal foil, and then moving the holding guide to the standby position; moving the holding guide to hold and fix the second inner metal foil with the bottom surface of the holding guide, and then moving the holding unit to the standby position; setting a second outer metal foil on the second inner metal foil; and performing a temporary bonding on the outer metal foils, the inner metal foils and the prepreg laminated by the above steps using the heater unit so as to obtain a temporary substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 5A and 5B are sectional views illustrating the states of the holding guide at a "standby position" and a "guided position," respectively;

DESCRIPTION OF EMBODIMENTS

To begin with, preliminary matters for facilitating understanding of embodiments are described with reference to FIGS. 1A to 2C before the embodiments are described.

FIGS. 1A to 2C are excerpts from part of the manufacturing method described in the above Patent document 1, illustrating steps of manufacturing a multilayer wiring board (coreless board) using a temporary substrate.

Figure 1A:
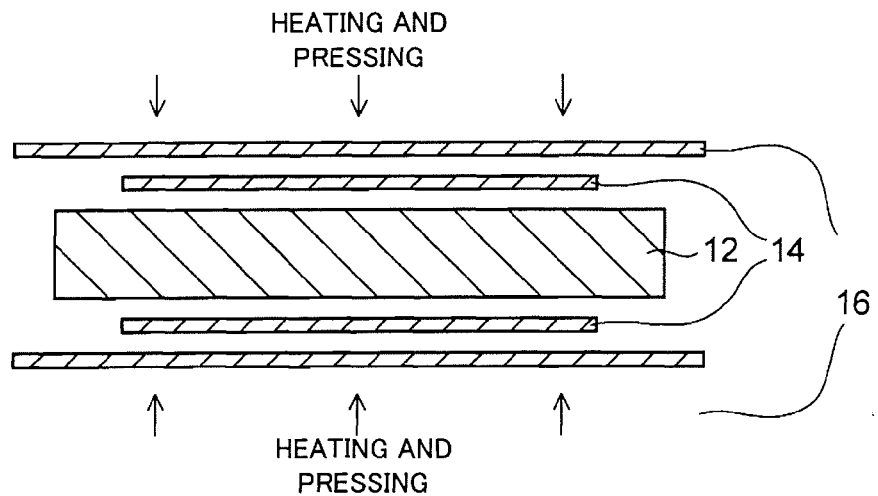
FIGS. 1A to 1C are views illustrating one example of steps of manufacturing a multilayer wiring board (coreless board) using a temporary substrate.
Figure 1B:
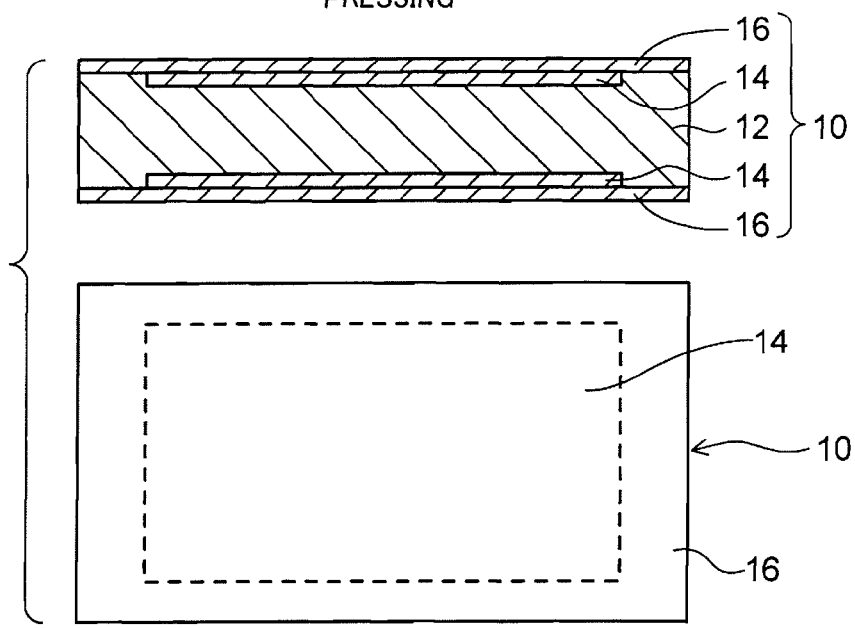

As illustrated in FIGS. 1A and 1B, constituent members of a temporary substrate 10 form a five-layer structure in which inner metal foils 14 are respectively disposed on both surfaces of a prepreg 12 in a semi-cured state and outer metal foils 16 are disposed on both surfaces of the inner metal foils 14. Each of the inner metal foils 14 has a smaller outer size than the prepreg 12 when seen in a plan view, and each of the outer metal foils 16 has a larger outer size than the prepreg 12 when seen in a plan view. These five layers in a superposed state are heated and pressed from both surface sides in a vacuum atmosphere by a laminating press. Thereby, the prepreg 12 is cured while being bonded to each of the metal foils 14 and 16, and then both end surfaces are straightened. Thus the temporary substrate 10 is manufactured.

The outer metal foils 16 are bonded to the prepreg 12 only at an outer peripheral portion (area outside a portion indicated by the dotted line in the plan view of the lower side in FIG. 1B) of the temporary substrate 10. In an area inside the outer peripheral portion, the inner metal foils 14 are in close contact with the outer metal foils 16 but are not bonded thereto. This inner area (portion inside the periphery of the inner metal foil 14) is utilized as a wiring formation area.

Figure 1C:
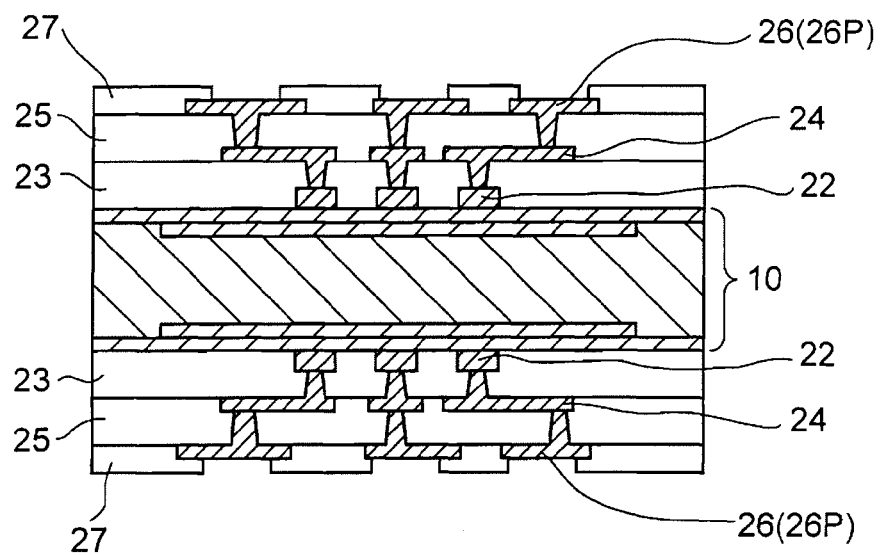

Subsequently, as illustrated in FIG. 1C, pads 22 are formed on both surfaces (within the wiring formation area) of the temporary substrate 10. Further, insulating layers 23, 25 and wiring layers 24, 26 are alternately laminated on both surfaces of the temporary substrate 10 so as to form a multilayer wiring structure. Then, protection films (solder resist layers) 27 are formed thereon, exposing portions corresponding to pads 26P defined at predetermined positions on the outermost wiring layers 26. Thus a structure is obtained in which multi-wiring layers are formed on both surfaces of the temporary substrate 10.

Figure 2A:
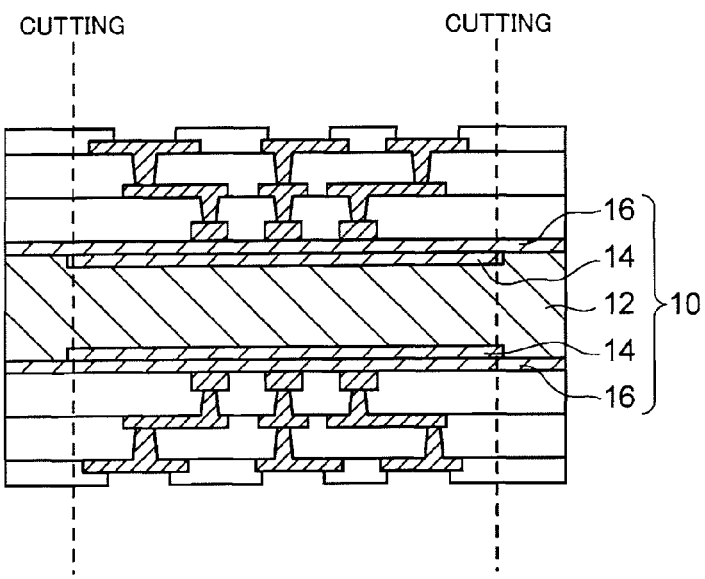
FIGS. 2A to 2C are views illustrating manufacturing steps subsequent to the steps of FIGS. 1A to 1C.
Figure 2B:
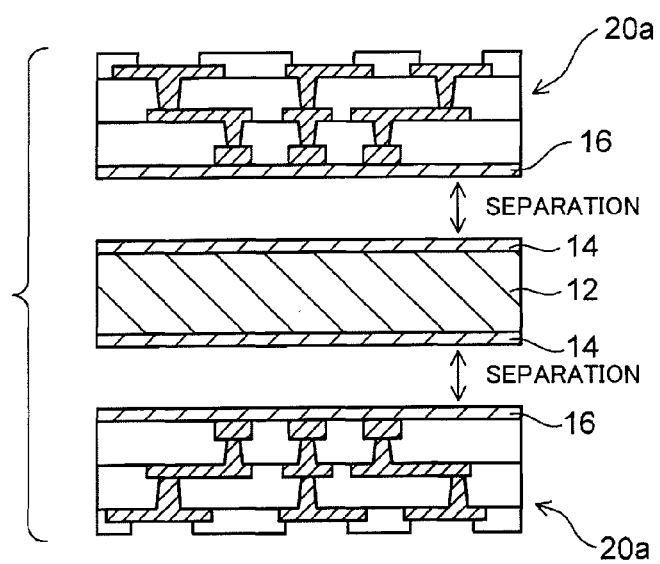
Figure 2C:
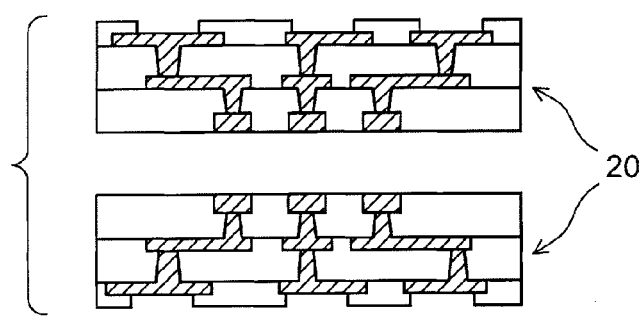

Subsequently, as illustrated in FIG. 2A, the structure is cut out at portions corresponding to the peripheries of the inner metal foils 14, removing the bonded portion in the outer peripheral portion of the temporary substrate 10. Thereby, as illustrated in FIG. 2B, the inner metal foil 14 and the outer metal foil 16 which have been in the close contact state are separated from each other and divided into two multi-wiring layer intermediates 20a each having the outer metal foil 16 adhering to one surface thereof, and into the prepreg 12 having the inner metal foils 14 adhering to both surfaces thereof. Further, the outer metal foil 16 adhering to the multi-wiring layer intermediate 20a is removed by etching or the like, and thereby two multilayer wiring boards (coreless board) 20 as illustrated in FIG. 2C are obtained.

As described above, in the process for a multilayer wiring board using a temporary substrate (FIGS. 1A to 2C), the bonded portion in the outer peripheral portion of the temporary substrate 10 is cut out and removed. Thus the inside of the bonded portion defines the wiring formation area. Accordingly, in order to secure the largest possible wiring formation area, the area of the bonded portion has to be smallest possible in such a manner that the inner metal foils 14 are disposed with high precision and that the bonded portion is cut out accurately at positions corresponding to the peripheries of the inner metal foils 14.

However, the state of the art is such that in the process of manufacturing a temporary substrate, effective means for positioning an inner metal foil with high precision has not yet been found.

Hereinafter, preferred embodiments of the invention are described.

Figure 3A:
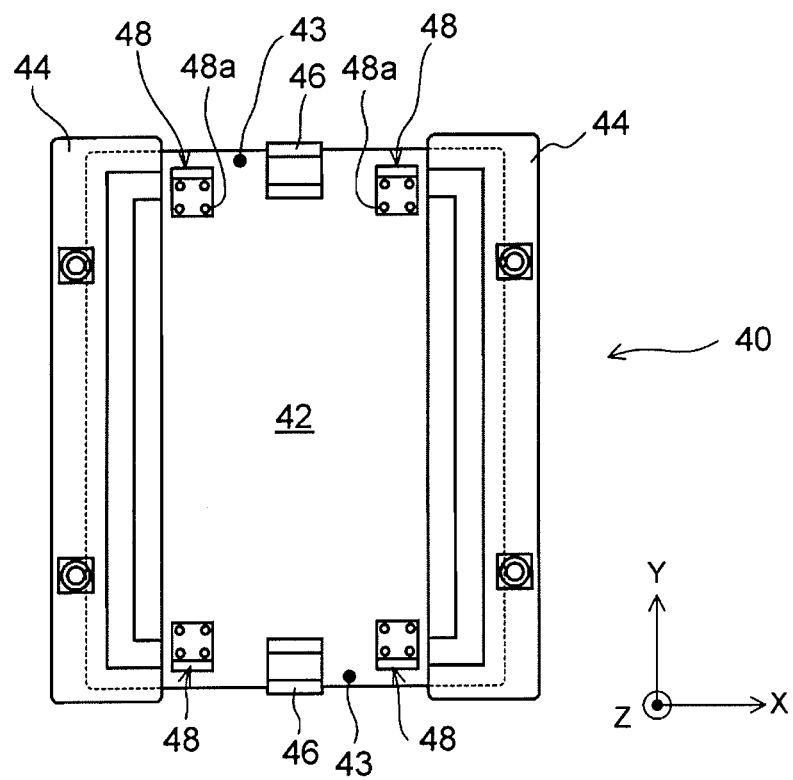
FIGS. 3A and 3B are views schematically illustrating the configuration of a jig used in an apparatus for manufacturing a temporary substrate according to one embodiment, and illustrate positional relations among members constituting the jig during use and standby, respectively.
Figure 3B:
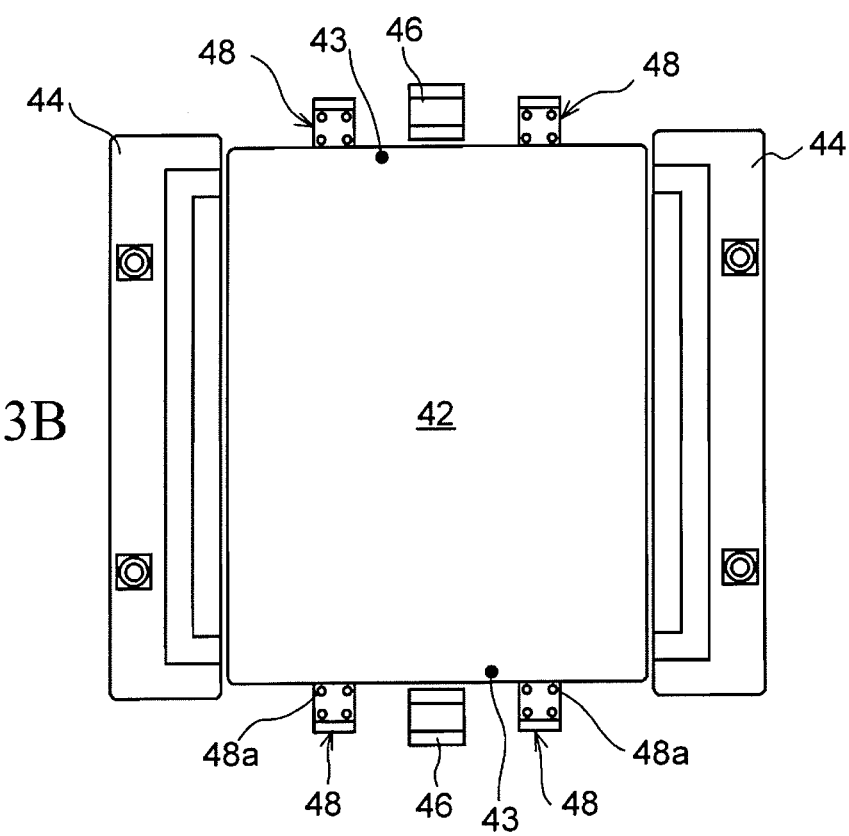

FIGS. 3A and 3B schematically illustrate in plan views the configuration of a jig used in an apparatus for manufacturing a temporary substrate according to one embodiment. In the drawings, FIG. 3A illustrates a positional relation among members constituting the jig during use, and FIG. 3B illustrates a positional relation among the members during standby.

Figure 13A:
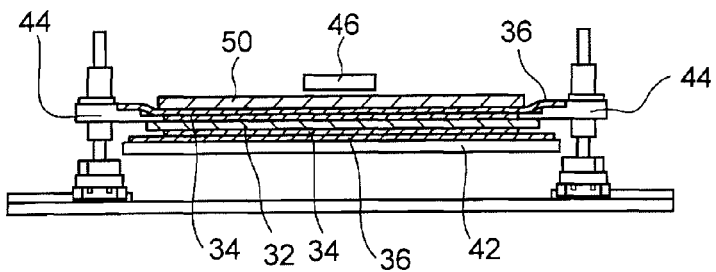
FIGS. 13A to 13C are sectional views illustrating manufacturing steps subsequent to the steps of FIGS. 12A to 12C.
Figure 13B:
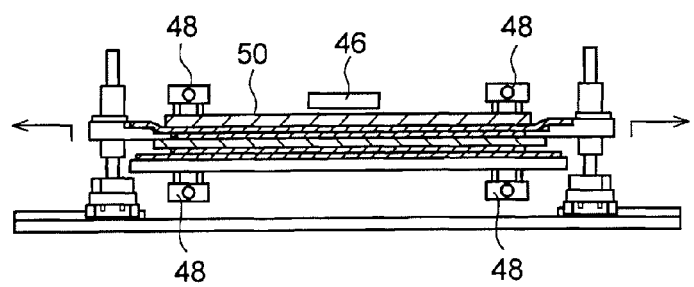
Figure 13C:
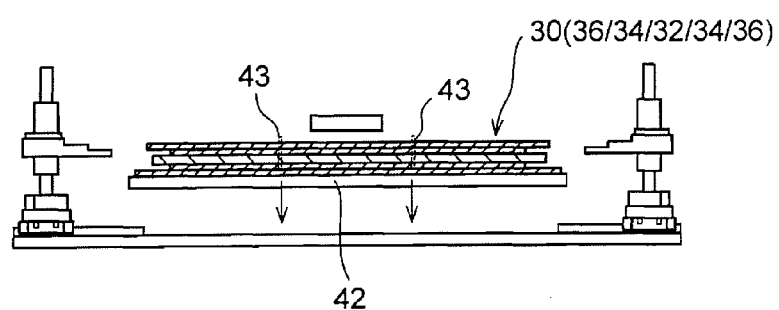

Although details of the manufacturing apparatus of this embodiment are described later, a temporary substrate manufactured with this manufacturing apparatus is used as a support in manufacturing a coreless board as described with reference to FIGS. 1A to 2C. In other words, the temporary substrate (support) to be manufactured is, as illustrated in FIG. 13C described later, a temporary substrate 30 having a five-layer structure in which inner metal foils 34 are respectively stacked on both surfaces of a prepreg 32 and outer metal foils 36 are respectively stacked on both surfaces of the inner metal foils 34. In this embodiment, a copper foil is used as the metal foils 34, 36. A glass cloth (woven fabric), a nonwoven glass fabric, aramide fibers, or the like impregnated with an epoxy resin is used as the prepreg 32.

The jig 40 used in this embodiment (FIGS. 3A and 3B) is intended to perform eventual temporary bonding on the constituent members (the outer copper foils 36, the inner copper foils 34, the prepreg 32) while fixing and holding the positions thereof in the process of manufacturing the temporary substrate 30 having the five-layer structure. The jig 40 basically includes a table 42 used as a support for laminating the constituent members, a holding guide 44, a holding unit 46 and a heater unit 48.

Among these members, each of the holding guide 44, the holding unit 46 and the heater unit 48 is in a state of physically contacting the constituent members (the illustration is omitted in FIGS. 3A and 3B) laminated on the table 42 during the use (FIG. 3A). Meanwhile, each member is released from the physical contact state during the standby (FIG. 3B). The example of FIG. 3A schematically illustrates the physical contact state with at least a portion of each member 44, 46, 48 being positioned on the table 42. Meanwhile, the illustrated example illustrated in FIG. 3B schematically illustrates the released state from the physical contact state with each member 44, 46, 48 being positioned outside the position on the table 42.

Note that FIG. 3B merely illustrates an example of the positional relation among the members 44, 46, 48 during the standby. It is a matter of course that the positional relation is not limited to the illustrated example. The point is that each member 44, 46, 48 should be at a position where the member is released from the physical contact state with the constituent members on the table 42. For example, for the heater unit 48, it suffices that when not to be used, the heater unit 48 in the state during the use is directly moved upward or downward (a Z direction perpendicular to an X-Y plane in the illustrated examples in FIGS. 3A and 3B) away from the constituent members. In this case, the heater unit 48 is positioned above or below the table 42.

The table 42 has a rectangular shape when seen in a plan view, and has a size slightly larger than the outer size of the outer copper foil 36. The material for the table 42 is not particularly limited, but the table 42 is desirably formed of a material having a favorable thermal conductivity. For example, a stainless steel, stainless alloy, or the like which is tough and also has a corrosion resistance is preferably used. This is because when the five layers of the constituent members laminated on the table 42 are temporarily bonded to one another with a heat from the heater unit 48 as described later, the material allows extra heat to easily escape to the table 42. In other words, during the temporary bonding, the material suppresses the range of the prepreg 32 melted to the vicinity of a portion where the prepreg 32 is in contact with the heater unit 48.

Figure 12A:
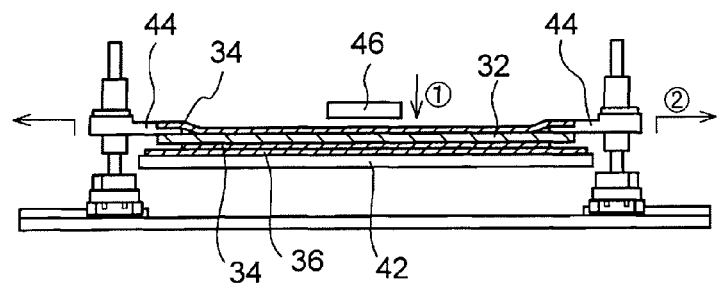
FIGS. 12A to 12C are sectional views illustrating manufacturing steps subsequent to the steps of FIGS. 11A to 11C.
Figure 12B:
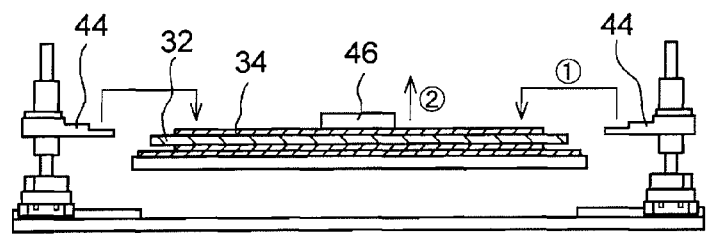
Figure 12C:
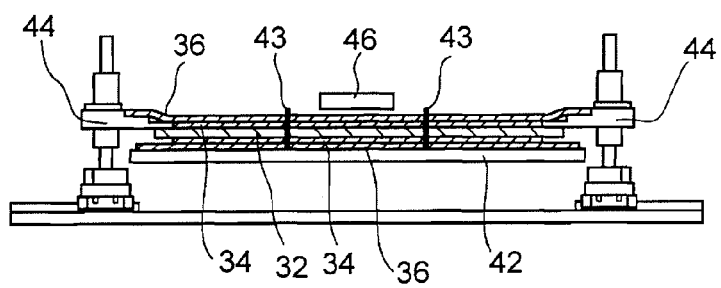

Moreover, positioning pins 43 are disposed at positions respectively near the peripheries of two sides of the rectangular table 42 opposed to each other (the two sides are opposed to each other in a Y direction in the illustrated examples in FIGS. 3A and 3B). The two positioning pins 43 are to fix the positions of the outer copper foils 36 thus set (see FIGS. 10B and 12C) so that the outer copper foils 36 do not move. The positioning pins 43 are provided at the positions of the table 42 in such a manner as to be movable vertically (the Z direction perpendicular to the X-Y plane in the illustrated examples in FIGS. 3A and 3B) with a drive mechanism including a cylinder described later. Thus, after the process of manufacturing the temporary substrate 30 is started, the positioning pins 43 keep their state of protruding from the top of the table 42 from the eventual temporary bonding of the constituent members (completion of the temporary substrate 30) until the temporary substrate 30 is taken out from the jig 40.

The holding unit 46 is to hold (tentatively fix) the laminated constituent members (in this case, the inner copper foils 34 and the prepreg 32) so that the constituent members do not move. The holding unit 46 is disposed near each of the two sides of the table 42 opposed to each other (the two sides are opposed to each other in the Y direction in the illustrated examples in FIGS. 3A and 3B). The arrangement of the holding units 46 and the number provided in the illustration are merely examples. It is a matter of course that the arrangement and the number are not limited to those in the illustrated examples. The point is that the holding units 46 should be disposed at such positions that the constituent members can be tentatively fixed. Accordingly, one or a plurality of the holding units 46 are provided as necessary.

Although the holding unit 46 has a function of tentatively fixing the constituent members as the holding guide 44 described below has, the function is demonstrated complementarily to that of the holding guide 44. Namely, when the holding guides 44 tentatively fix the constituent members at in-use positions illustrated in FIG. 3A, the holding units 46 are at standby positions illustrated in FIG. 3B. Meanwhile, when the holding units 46 are moved to in-use positions illustrated in FIG. 3A (hold positions) to hold the constituent members, the holding guides 44 are at standby positions illustrated in FIG. 3B. The holding units 46 are driven with a drive mechanism described later to move between the in-use positions (hold positions) and the standby positions.

The heater unit 48 is for performing the temporary bonding on the five layers of the constituent members laminated on the table 42. Although only four heater units 48 are illustrated in FIGS. 3A and 3B, actually four other heater units 48 are provided on the lower surface side of the table 42, also (8 in total) (see FIG. 7). Namely, the two heater units 48 are disposed at positions near each of the two sides on the upper surface side of the table 42 opposed to each other (the two sides are opposed to each other in the Y direction in the illustrated examples in FIGS. 3A and 3B) with the holding unit 46 located therebetween. The heater units 48 are additionally disposed on the lower surface side of the table 42 at positions corresponding to those on the upper surface side (see FIG. 14).

Each of the heater units 48 includes four heating parts (heater tip end parts) 48a columnarly protruding. As exemplified in FIG. 14, each of the heater tip end parts 48a of the heater unit 48 disposed on the lower surface side of the table 42 and each of the heater tip end parts 48a of the heater unit 48 on the upper surface side corresponding thereto are pressed against the constituent members 36/34/32/34/36 laminated on the table 42 from both surface sides. Thereby, the temporary bonding is performed. The heater units 48 are also driven with a drive mechanism described later to move between the in-use positions and the standby positions.

Note that FIGS. 3A and 3B merely illustrate examples of the arrangement of the heater units 48 and the number provided. It is a matter of course that the arrangement and the number are not limited to those in the illustrated examples. The point is that the heater tip end parts 48a of each heater unit 48 should be disposed such that the constituent members on the table 42 can be pressed from both surface sides as exemplified in FIG. 14.

Figure 4A:
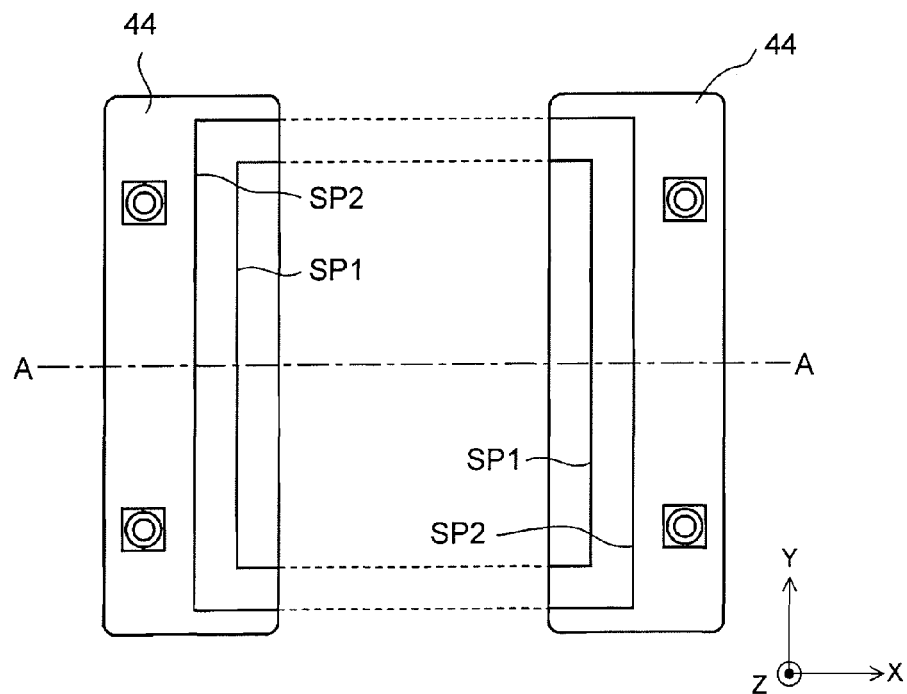
FIGS. 4A and 4B are views illustrating the configuration of a holding guide of the jig in FIGS. 3A and 3B, FIG. 4A being a plan view thereof, and FIG. 4B being a sectional view taken along the line A-A in FIG. 4A.
Figure 4B:
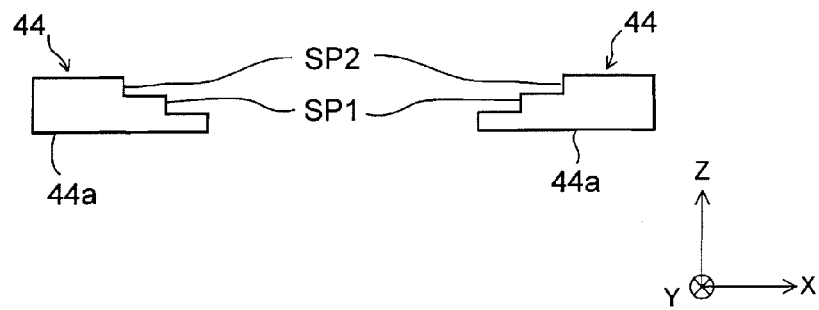

FIGS. 4A and 4B illustrate the configuration of the holding guide 44 serving as the main constituent of the jig 40. FIG. 4A is a plan view thereof, and FIG. 4B is a sectional view when seen along the line A-A in FIG. 4A. In addition, FIGS. 5A and 5B schematically illustrate the function of the holding guide 44. FIG. 5A illustrates in a sectional view the state of the holding guide 44 at a "standby position" (the standby position illustrated in FIG. 3B). FIG. 5B illustrates in a sectional view the state of the holding guide 44 at a "guided position" (the in-use position illustrated in FIG. 3A).

The holding guide 44 is separated into two parts as illustrated in FIGS. 4A and 4B. The two holding guides 44 thus separated are formed to have two step portions SP1, SP2 (see FIG. 4B). The holding guides 44 are disposed to face each other, and portions where the step portions SP1, SP2 are formed are directed inward. The first step portions SP1 provided on the lower sides of the holding guides 44 and the second step portions SP2 provided on the upper sides thereof are respectively formed in such a manner that the peripheries of the corresponding step portions and portions extending from the peripheries (portions indicated by the dotted lines) define rectangular areas in the plan view of the two holding guides 44 disposed to face each other (see FIG. 4A).

In this embodiment, the first step portions SP1 of the holding guides 44 are used when the inner copper foils 34 each having a smaller outer size than the prepreg 32 is set (see the top of FIG. 5B). The inner copper foils 34 are accurately positioned with the rectangular area (see FIG. 4A) defined by the two step portions SP1 disposed to face each other. Namely, the size of the rectangular area in this case corresponds to the outer size of the inner copper foils 34. Meanwhile, the second step portions SP2 are used when the prepreg 32 having a smaller outer size than the outer copper foil 36 is set (see the bottom of FIG. 5B). The prepreg 32 is accurately positioned with the rectangular area (see FIG. 4A) defined by the two step portions SP2 disposed to face each other. Similarly, the size of the rectangular area in this case corresponds to the outer size of the prepreg 32.

In this manner, the holding guides 44 play a role of guiding the constituent members (in this case, the inner copper foils 34 and the prepreg 32) to predetermined positions for positioning in the process of manufacturing the temporary substrate 30. Further, the holding guides 44 also play a role of holding (tentatively fixing) the laminated constituent members (the outer copper foils 36, the inner copper foils 34, the prepreg 32) with guide bottom surfaces 44a.

The holding guides 44 are driven with a drive mechanism described later to move between the standby positions and the guided positions as illustrated in FIGS. 5A and 5B. When the holding guides 44 in the state of holding the constituent members with the guide bottom surfaces 44a are directly moved horizontally (an X direction illustrated in FIGS. 3A to 4B) from the guided positions to the standby positions, the members thus held (particularly, the copper foils 34, 36) may be damaged by friction. To avoid this, the holding guides 44 are moved slightly upward (the Z direction illustrated in FIGS. 4A and 4B) and then moved horizontally and outwardly from the table 42 (see, for example, FIGS. 10C, 11B, and so forth).

In contrast, when the holding guides 44 are directly moved horizontally from the standby positions to the guided positions also, tip end portions of the holding guides 44 may be damaged by being brought into contact with the laminated members. To avoid this, the holding guides 44 are moved slightly upward and then moved horizontally and inwardly toward the table 42. When reaching predetermined guided positions, the holding guides 44 are moved downward (see, for example, FIGS. 10B, 11A, and so forth).

When the mode of moving from the standby positions to guided positions and the mode of moving from the guided positions to the standby positions as described above are seen from a side, the holding guides 44 move in a box (square box)-like movement. In this sense, such a movement is also referred to as a "box movement" for convenience in the description below.

This embodiment has been described by taking the example where the holding guide 44 is separated into two parts (FIGS. 4A and 4B). Nevertheless, in considering the roles played by the holding guide (the role of positioning the constituent members to be laminated, and the role of holding and fixing the laminated constituent members with the guide bottom surface), it is a matter of course that the configuration of the holding guide is not necessarily limited to the above example.

Figure 6:
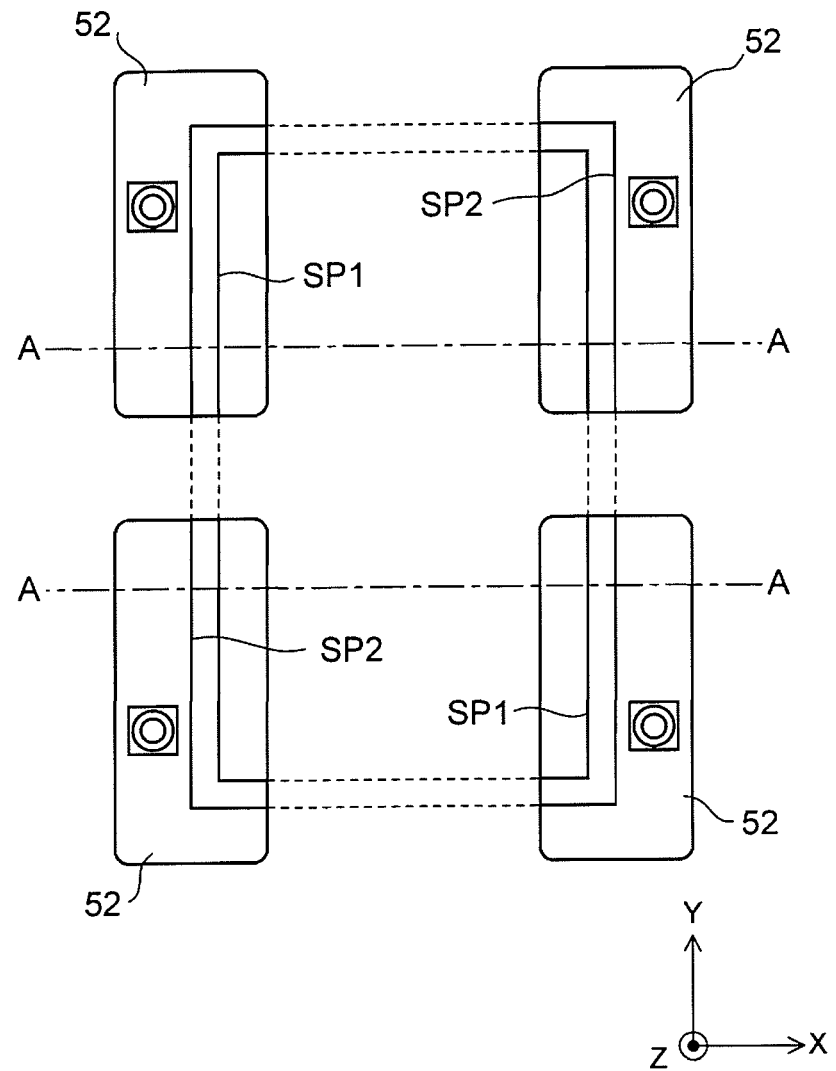
FIG. 6 is a plan view illustrating the configuration of a holding guide in one modified example.

FIG. 6 illustrates in a plan view the configuration of a holding guide 52 in one modified example. In the drawing, the sectional structure when seen along the lines A-A is the same as that illustrated in FIG. 4B.

The holding guide 52 of this embodiment is separated into four parts as illustrated in FIG. 6. As similar to the holding guides 44 in the above embodiment, the four holding guides 52 thus separated are formed to have the two step portions SP1, SP2 (see FIG. 4B) on the lower and the upper sides. The holding guides 52 are disposed to face each other, and portions where the step portions SP1, SP2 are formed are directed inward. The first step portions SP1 provided on the lower sides of the holding guides 52 and the second step portions SP2 provided on the upper sides thereof are respectively formed in such a manner that the peripheries of the corresponding step portions and portions extending from the peripheries (portions indicated by the dotted lines) define rectangular areas in the plan view of the four holding guides 52 disposed to face each other (see FIG. 6).

The mode of use of the step portions SP1, SP2 provided on the holding guides 52 and the mode of moving the holding guides 52 are the same as those of the holding guides 44 in the above embodiment.

Figure 7:
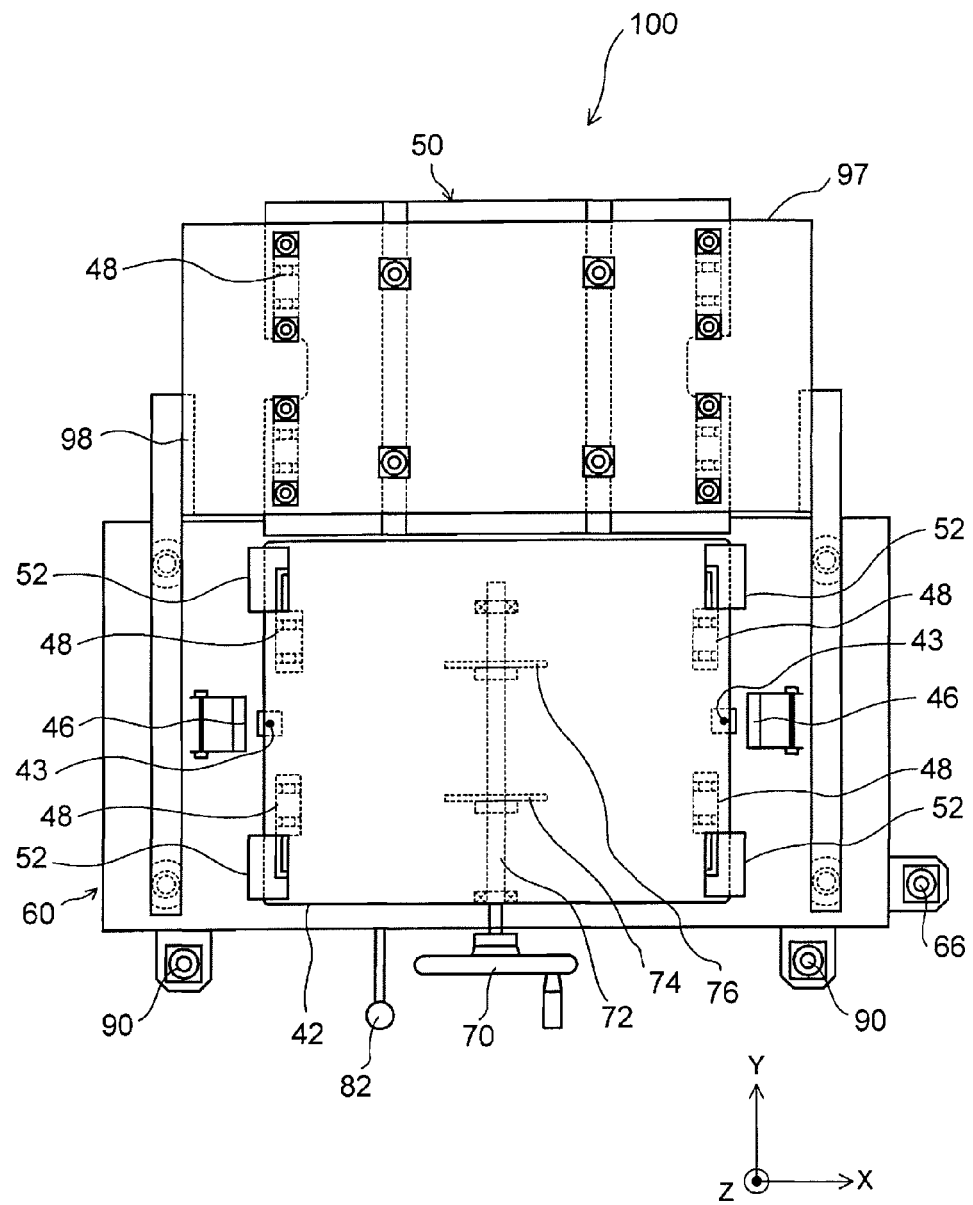
FIG. 7 is a view illustrating the configuration of the apparatus for manufacturing a temporary substrate in one embodiment, when seen in a plan view from the above.
Figure 8:
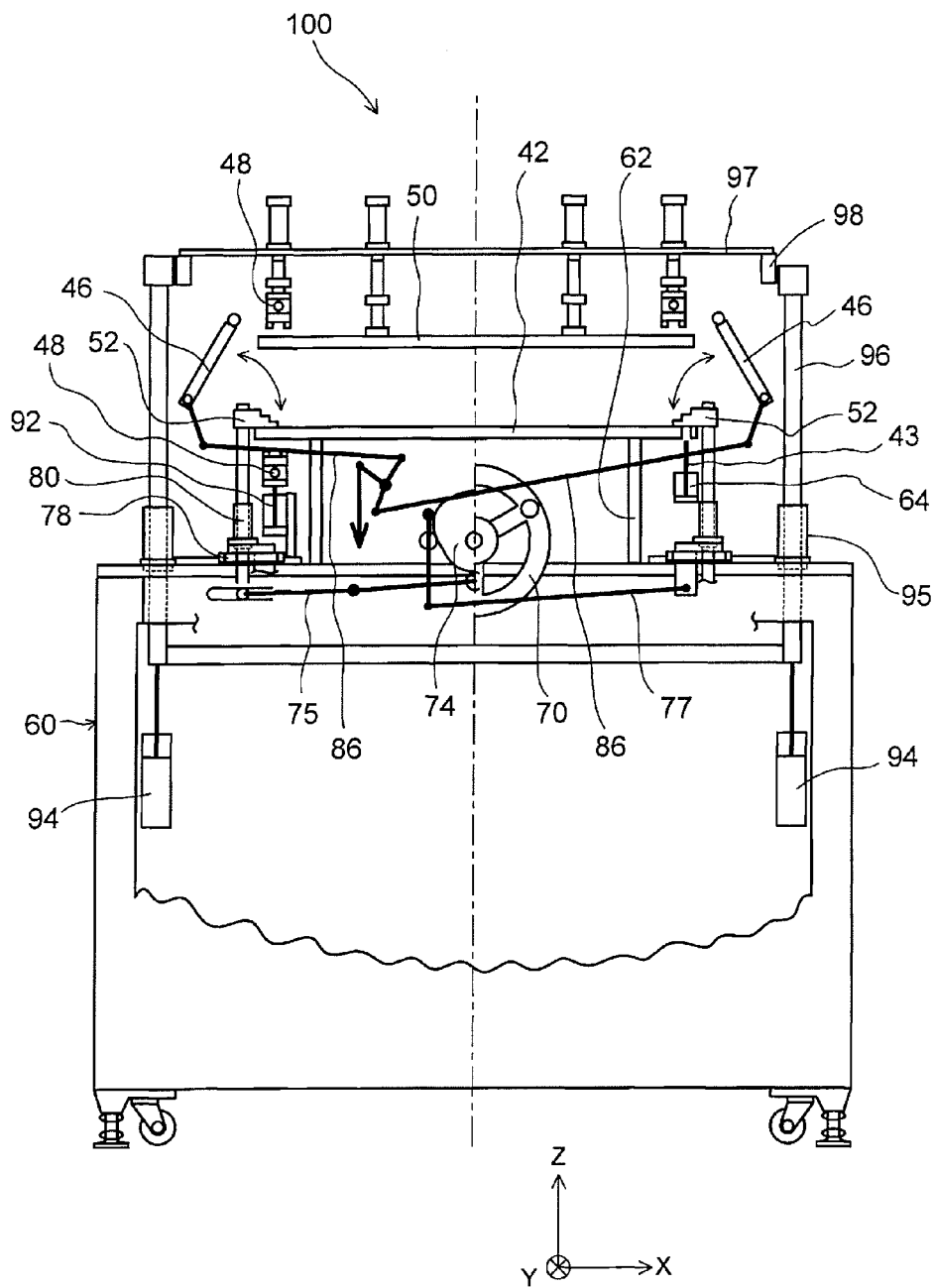
FIG. 8 is a view illustrating, in a partially cut-out manner, the configuration of the manufacturing apparatus illustrated in FIG. 7, when seen in a front view.
Figure 9:
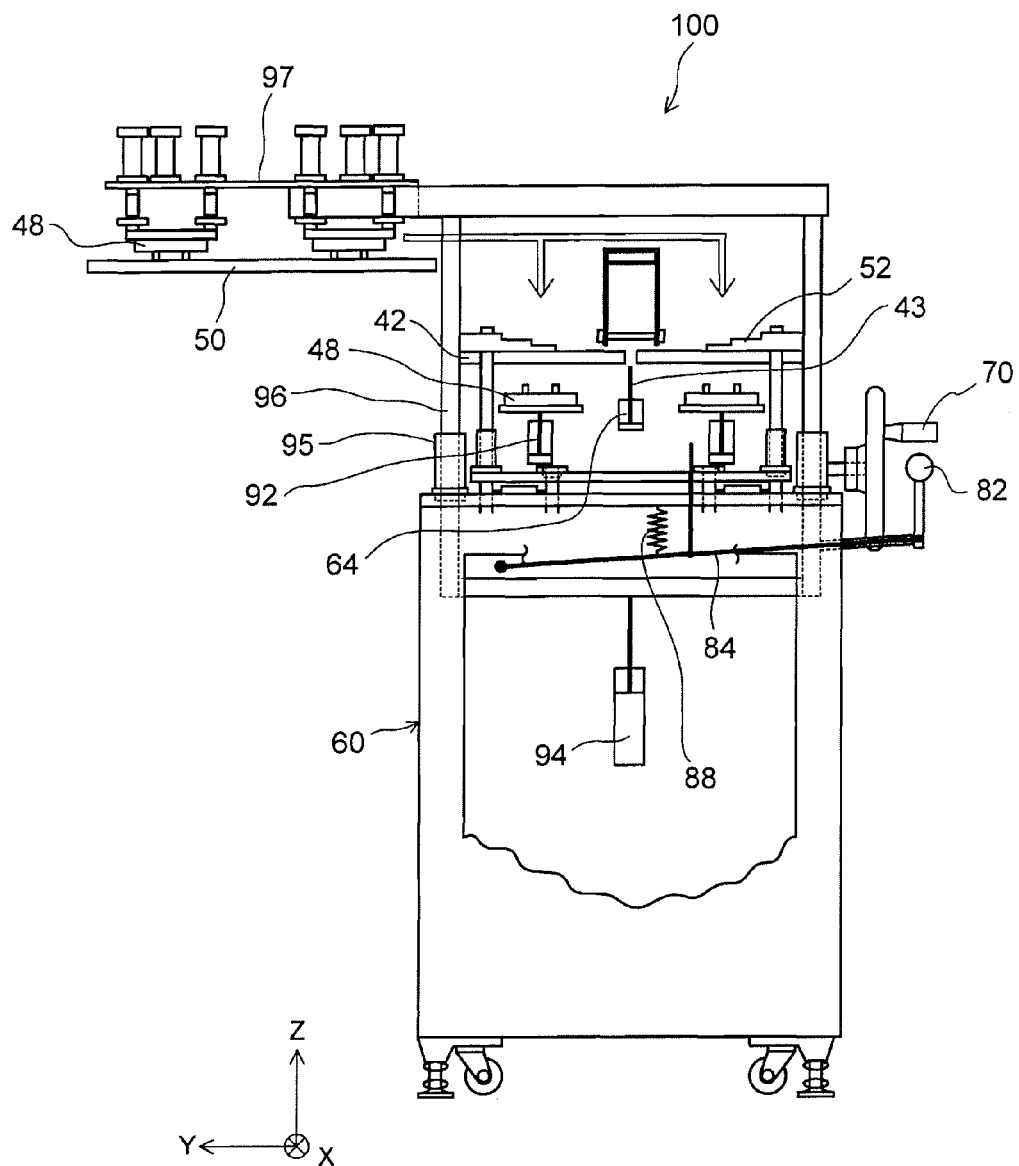
FIG. 9 is a view illustrating, in a partially cut-out manner, the configuration of the manufacturing apparatus illustrated in FIG. 7, when seen in a left side view.

Next, an apparatus for manufacturing a temporary substrate according to one embodiment is described with reference to FIGS. 7 to 9. FIG. 7 illustrates the configuration of the manufacturing apparatus, when seen in a plan view from the above. FIG. 8 illustrates the configuration of the partially-cut-out manufacturing apparatus, when seen in a front view. FIG. 9 illustrates the configuration of the partially-cut-out manufacturing apparatus, when seen in a left side view.

FIGS. 7 to 9 merely illustrate one example of a manufacturing apparatus 100. It is a matter of course that the present invention is not limited to the illustrated configuration. Accordingly, modifications are made as appropriate on the arrangement of members constituting the manufacturing apparatus 100, particularly, the shapes and arrangement of the members constituting the jig 40 (FIGS. 3A and 3B) serving as the main constituent of the manufacturing apparatus 100.

First, at a predetermined height position from a mount 60 (see FIG. 8) serving as a base, the table 42 is fixed with a plurality of posts 62 standing and provided to the mount 60, the table 42 being in parallel to an upper surface of the mount 60. Additionally, the positioning pins 43 are disposed at the positions respectively near the peripheries of the two sides of the table 42 opposed to each other (the two sides are opposed to each other in an X direction in the illustrated example in FIG. 7).

The positioning pins 43 are provided at the positions of the table 42 in such a manner as to be movable vertically (Z direction) with vertical cylinders 64 (FIG. 8). The vertical cylinders 64 are driven vertically through operation of a positioning pin-operation switch 66 (FIG. 7). First, by pushing the operation switch 66, the positioning pins 43 are elevated and protrude from the top of the table 42 through openings provided in the table 42. In this state, the constituent members are laminated on the table 42. By pushing the operation switch 66 after the eventual temporary bonding performed on the constituent members, the positioning pins 43 are lowered and returned to the original positions in the standby state. On this occasion, the temporary substrate 10 thus completed is taken out.

Moreover, in the manufacturing apparatus 100 (FIG. 7), the holding guide 52 constituted of the four parts exemplified in FIG. 6 is used. The holding guides 52 are driven to move between the standby positions and the guided positions as exemplified in FIGS. 5A and 5B. As the drive mechanism therefor, the manufacturing apparatus 100 includes: a holding guide-operation handle 70 (FIGS. 7 and 8); a right-left-direction (X direction) drive cam 74 and a vertical-direction (Z direction) drive cam 76 (FIG. 7) fixed to a rotation shaft 72 of the operation handle 70; and a right-left-direction (X direction) guide 78 and a vertical-direction (Z direction) guide 80 respectively coupled to the drive cams 74, 76 through linking mechanisms 75, 77 (FIG. 8). The right-left-direction and the vertical-direction guides 78, 80 are mechanically coupled to the four holding guides 52 thus divided.

Namely, when the right-left-direction and the vertical-direction drive cams 74, 76 are rotated by one turn through operation of the operation handle 70, the holding guides 52 perform a series of operations (box movement) through the linking mechanism 75, 77 and further through the right-left-direction and the vertical-direction guides 78, 80.

Further, in the manufacturing apparatus 100 (FIG. 7), the holding units 46 are respectively disposed near the two sides of the table 42 opposed to each other (the two sides are opposed to each other in the X direction in the illustrated example in FIG. 7). The holding units 46 are driven to move between the standby positions and the in-use positions (hold positions) as exemplified in FIGS. 3A and 3B. As the drive mechanism therefor, the manufacturing apparatus 100 includes: a holding unit-operation lever 82 (FIG. 9); an arm 84 (FIG. 9) having one end coupled to the operation lever 82 and the other fixed; a plurality of linking mechanisms 86 (FIG. 8) coupled to the arm 84; and a return spring 88 for returning the operation lever 82 thus operated to the original position. The holding units 46 are respectively coupled to the linking mechanisms 86.

Namely, through operation (lowering in the Z direction) of the operation lever 82 when the laminated constituent members need to be held (tentatively fixed), the holding units 46 are operated (moved to the hold positions) with the arm 84 and the plurality of linking mechanisms 86. On this occasion, the lowered state of the operation lever 82 is kept the same. When it is no longer necessary to hold the members with the holding units 46, by releasing the operation lever 82 from the hand, the operation lever 82 is returned to the original position with the return spring 88.

In addition, in the manufacturing apparatus 100 (FIG. 7), the eight heater units 48 are disposed in total. Among them, two of the four (lower heater units 48) are disposed below the table 42 at the positions near each of the two sides of the table 42 opposed to each other (the two sides are opposed to each other in the X direction in the illustrated example in FIG. 7) with the holding unit 46 located therebetween. The other four (upper heater units 48) are at the standby positions in the illustrated example (FIGS. 7 and 9). During the use, the upper heater units 48 are driven to move to the positions above the table 42 corresponding to the respective positions of the lower heater units 48 (see FIG. 14).

As the drive mechanism therefor, the manufacturing apparatus 100 includes: a pair of heater unit-operation switches 90 (FIG. 7); a lower-heater vertical cylinder 92 and an upper-heater vertical cylinder 94 (FIGS. 8 and 9) each operated in response to a simultaneous operation (pushing with both hands) of the operation switches 90; a vertical rod 96 coupled to the upper-heater vertical cylinder 94, inserted into an upper-heater vertical guide 95, and moved vertically (Z direction); a holding plate 97 disposed to move vertically together with the movement of the vertical rod 96; and an upper-heater front-back direction moving guide 98 for moving the upper heater units 48 in the front-back direction (Y direction).

Furthermore, immediately below the upper heater units 48 (see FIGS. 8 and 9), a metal plate 50 for removing a wrinkle in the copper foil/preventing prepreg infiltration to be described later is fixed to the holding plate 97 with a support post. The metal plate 50 is at the standby position in the illustrated example.

When the five layers of the constituent members laminated on the table 42 are temporarily bonded, first, the holding plate 97 holding the upper heater units 48 is pulled out toward the near side (in the Y direction). Then, by pushing the pair of operation switches 90 with both hands, the vertical cylinders 92, 94 for the lower-heaters and the upper-heaters are operated. Thereby, the lower heater units 48 are elevated by the vertical cylinder 92, while the upper heater units 48 are lowered by the downward (Z direction) movement of the vertical rod 96 coupled to the vertical cylinder 94. On this occasion, as the upper heater units 48 are lowered, the metal plate 50 held by the holding plate 97 is also lowered. Then, the temporary bonding of the constituent members is performed as described later.

Next, a method of manufacturing a temporary substrate according to one embodiment is described with reference to FIGS. 10A to 13C illustrating one example of the manufacturing steps.

First, in the initial step (see FIG. 10A), the jig 40 is set to an initial state. Namely, the holding guides 44, the holding units 46, and the heater units 48 are respectively moved to predetermined standby positions as illustrated in FIG. 3B with the drive mechanisms as exemplified in FIGS. 7 to 9. In addition, the vertical cylinders 64 (FIG. 8) are driven, so that the two positioning pins 43 protrude from the top of the table 42.

Note that the illustration of the heater units 48 is omitted in each process drawing from this step until a step (FIG. 13A) which is immediately before a step of performing the temporary bonding on the constituent members.

In the next step (see FIG. 10B), the outer copper foil 36 is set on the table 42 in accordance with the positioning pins 43 provided at two positions of the table 42. The outer copper foil 36 thus set is selected to have, for example, a length of approximately 300 mm to 600 mm, a width of approximately 300 mm to 600 mm, and a thickness of approximately 8 μm to 80 μm. When set, the outer copper foil 36 has pin-insertion holes provided in advance at positions corresponding to the positions of the positioning pins 43 on the table 42 side. Thereby, the outer copper foil 36 is held on the table 42 by the two positioning pins 43.

Figure 10A:
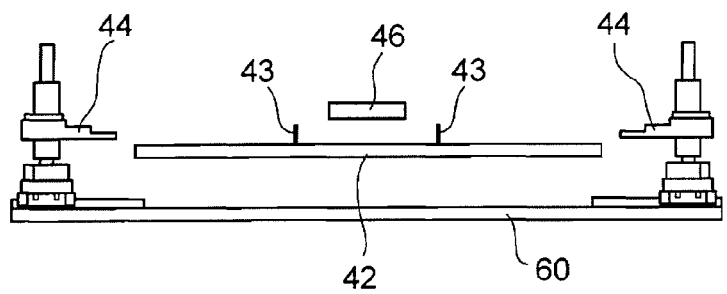
FIGS. 10A to 10C are sectional views illustrating a method of manufacturing a temporary substrate in one embodiment in the sequence of steps.
Figure 10B:
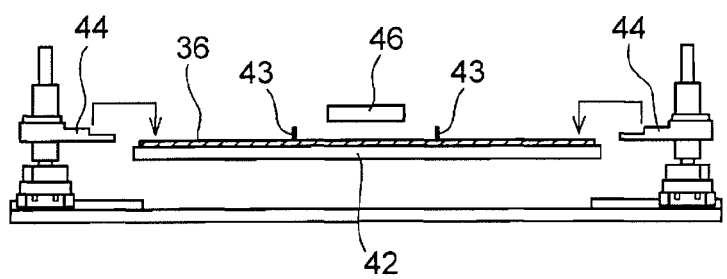

Then, the holding guides 44 are moved from the standby positions (FIG. 5A) to the guided positions (FIG. 5B) (box movement). The outer copper foil 36 held on the table 42 is thereby held and fixed with the guide bottom surfaces 44a (see FIGS. 5A and 5B) of the holding guides 44. In FIG. 10B, the arrows denoted to the holding guide 44 indicate the states of its movements.

In the next step (see FIG. 10C), the inner copper foil 34 is stacked on the outer copper foil 36 held on the table 42. Namely, the inner copper foil 34 is set on the first step portions SP1 (FIGS. 4A to 5B) of the holding guides 44 holding the outer copper foil 36. The inner copper foil 34 thus set is selected to have a size, for example, smaller than the outer size of the prepreg 32 by approximately 2 mm to 100 mm, and a thickness of approximately 8 μm to 80 μm.

Figure 10C:
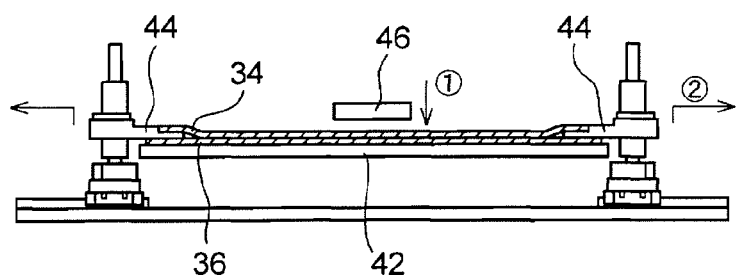

Then, the holding units 46 are moved from the standby positions (FIG. 3B) to the hold positions (FIG. 3A), and hold the stacked inner copper foil 34 so that the inner copper foil 34 does not move. Thereafter, the holding guides 44 are moved from the guided positions to the standby positions (box movement). In FIG. 10C, the numbers 1, 2 surrounded by ○ represents the sequence of these operations. The arrows denoted to the numbers 1, 2 with ○ indicate the states of the movements of the holding units 46 and the holding guides 44. The same holds for the numbers with ○ and the arrows denoted thereto illustrated in the following process drawings.

Note that the illustration of the positioning pins 43 is omitted in each process drawing from this step until a step (FIG. 12B) which is immediately before a step of setting the second outer copper foil 36.

In the next step (see FIG. 11A), the holding guides 44 are moved from the standby positions to the guided positions (box movement). The inner copper foil 34 stacked on the outer copper foil 36 is thereby held and fixed with the guide bottom surfaces 44a (see FIGS. 5A and 5B) of the holding guides 44. Subsequently, the holding units 46 are moved from the hold positions to the standby positions.

In the next step (see FIG. 11B), the prepreg 32 is stacked on the inner copper foil 34 stacked on the outer copper foil 36 in the similar manner to the operation performed in the step of FIG. 10C. Namely, the prepreg 32 is set on the second step portions SP2 (FIGS. 4A to 5B) of the holding guides 44 holding the inner copper foil 34. The prepreg 32 thus set is selected to have a size, for example, smaller than the outer size of the outer copper foil 36 by approximately 5 mm to 100 mm, and a thickness of approximately 60 μm to 1.0 mm.

Then, the holding units 46 are moved from the standby positions to the hold positions, and hold the stacked prepreg 32 so that the prepreg 32 does not move. Thereafter, the holding guides 44 are moved from the guided positions to the standby positions (box movement).

Figure 11A:
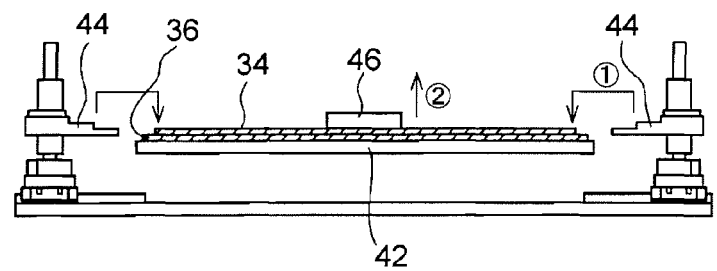
FIGS. 11A to 11C are sectional views illustrating manufacturing steps subsequent to the steps of FIGS. 10A to 10C.
Figure 11B:
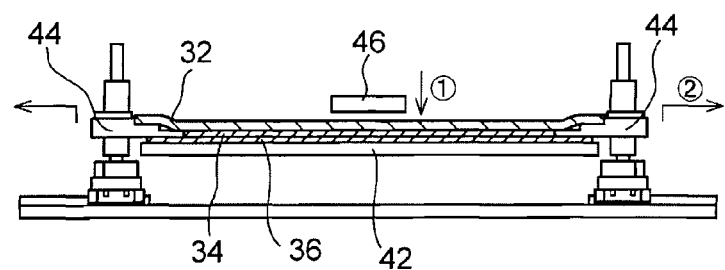
Figure 11C:
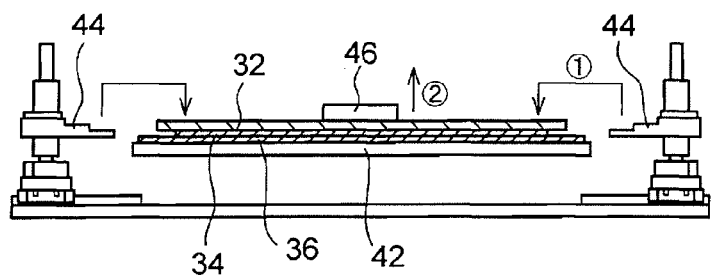

In the next step (see FIG. 11C), the holding guides 44 are moved from the standby positions to the guided positions (box movement) in the similar manner to the operation performed in the step of FIG. 11A. The prepreg 32 stacked on the inner copper foil 34 is thereby held and fixed with the guide bottom surfaces 44a (see FIGS. 5A and 5B) of the holding guides 44. Subsequently, the holding units 46 are moved from the hold positions to the standby positions.

In the next step (see FIG. 12A), the second inner copper foil 34 is stacked on the prepreg 32 stacked on the inner copper foil 34 in the similar manner to the operation performed in the step of FIG. 10C. Namely, the inner copper foil 34 is set on the first step portions SP1 (FIGS. 4A to 5B) of the holding guides 44 holding the prepreg 32.

Then, the holding units 46 are moved from the standby positions to the hold positions, and hold the stacked inner copper foil 34 so that the inner copper foil 34 does not move. Thereafter, the holding guides 44 are moved from the guided positions to the standby positions (box movement).

In the next step (see FIG. 12B), the holding guides 44 are moved from the standby positions to the guided positions (box movement) in the similar manner to the operation performed in the step of FIG. 11A. The inner copper foil 34 stacked on the prepreg 32 is thereby held and fixed with the guide bottom surfaces 44a (see FIGS. 5A and 5B) of the holding guides 44. Subsequently, the holding units 46 are moved from the hold positions to the standby positions.

In the next step (see FIG. 12C), the second outer copper foil 36 is set on the inner copper foil 34 held with the guide bottom surfaces 44a (see FIGS. 5A and 5B) of the holding guides 44 in accordance with the positioning pins 43 provided at the two positions of the table 42. The outer copper foil 36 has the same size and thickness as those of the outer copper foil 36 set at the beginning, and similarly has pin-insertion holes provided at predetermined positions. Thereby, the position of the second outer copper foil 36, together with the first outer copper foil 36, is fixed by the two positioning pins 43.

When the second outer copper foil 36 is set, an alignment mark or a small hole for alignment (unillustrated) is provided in advance at a predetermined position in the second outer copper foil 36. Desired marking can be made by, for example, scribing, inkjet, stamping, imprinting, laser, or the like. The alignment mark or the like thus provided makes it possible to grasp the position of the inner copper foil 34 without performing radioscopy on the second outer copper foil 36 by an X-ray or the like. Accordingly, alignment can be easily made in a step of forming a multi-wiring layer on the temporary substrate 10 performed at a later stage.

In this step, the three layers of the members (the inner copper foil 34, the prepreg 32, the inner copper foil 34) interposed between the two outer copper foils 36, 36 fixed by the positioning pins 43 are in a state of simply being sandwiched therebetween, but held with the guide bottom surfaces 44a (see FIGS. 5A and 5B) of the holding guides 44. Thus, the laminated five layers of the constituent members as a whole are in such a state that the positional relation thereamong is fixed.

It should be noted, however, that although the position of the uppermost outer copper foil 36 is fixed, the copper foil may wave even to a small extent due to air flow or the like, generating a "wrinkle." Accordingly, the surface is not always flat. Thus, it is desirable to take a countermeasure in order to ensure the flat state of the surface of the outer copper foil 36.

In the next step (see FIG. 13A), the metal plate 50 as a plate-shaped member is set on the uppermost outer copper foil 36 of the laminated structure. The metal plate 50 (plate-shaped member) presses down the outer copper foil 36 by its weight, eliminating the generation of a "wrinkle," and plays a role of "removing a wrinkle in the copper foil" to ensure the flat state of the surface. In this regard, the material used is not necessarily limited to a metal material, but a material having a favorable thermal conductivity (stainless steel or the like) as similar to the table 42 is used in this embodiment.

In the next step (see FIG. 13B), the laminated five layers of the constituent members (see FIG. 13A, in the sequence from the bottom, the outer copper foil 36, the inner copper foil 34, the prepreg 32, the inner copper foil 34, the outer copper foil 36) are temporarily bonded to one another using the heater units 48. This "temporary bonding" process is described with reference to FIG. 14 also.

Figure 14:
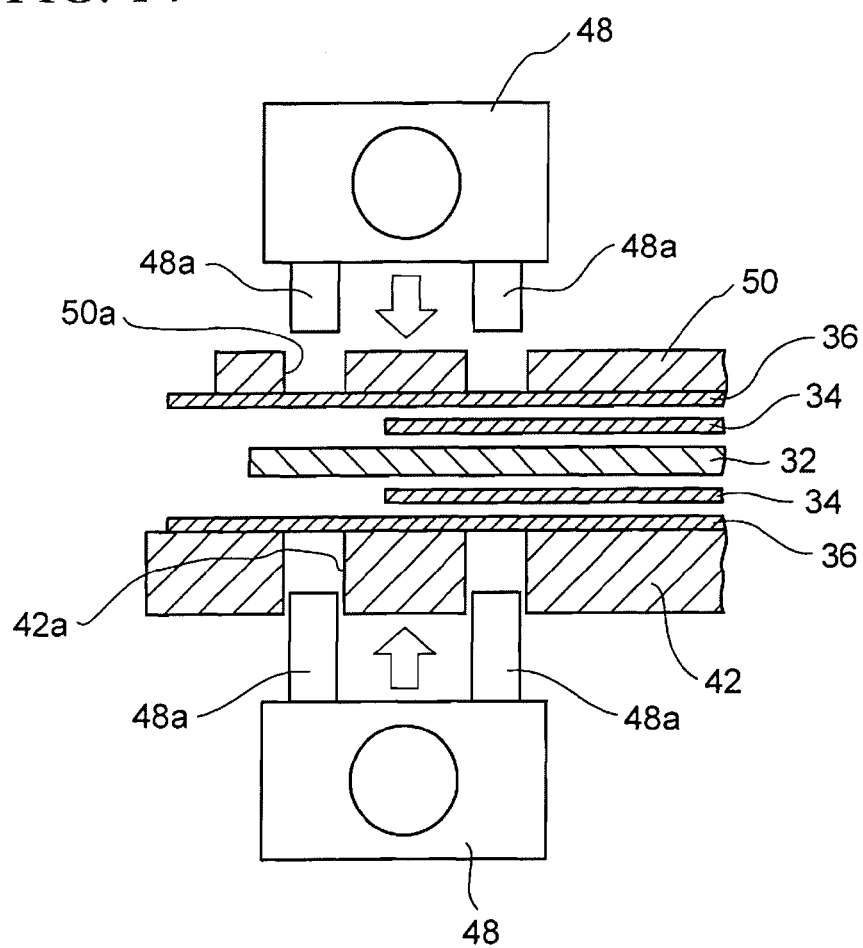
FIG. 14 is a view for supplementarily explaining a "temporary bonding" process performed in FIG. 13B.

First, the upper heater units 48 are moved to the in-use positions with the drive mechanisms as exemplified in FIGS. 7 to 9. Namely, as illustrated in FIG. 14, the heater tip end parts 48a of the upper heater unit 48 are moved to face the corresponding heater tip end parts 48a of the lower heater unit 48. Further, while the lower heater unit 48 is elevated, the upper heater unit 48 is lowered.

On this occasion, the metal plate 50 set on the laminated structure (the five layers of the constituent members) on the table 42 is provided with openings 50a for respectively inserting the heater tip end parts 48a of the upper heater unit 48 thereinto. Similarly, the table 42 is also provided with openings 42a for respectively inserting the heater tip end parts 48a of the lower heater unit 48. Thus, as the lower heater unit 48 is moved and elevated, the heater tip end parts 48a thereof are inserted into the openings 42a of the table 42 and pressed against the lowermost outer copper foil 36. Meanwhile, as the upper heater unit 48 is moved and lowered, the heater tip end parts 48a thereof are inserted into the openings 50a of the metal plate 50 and pressed against the uppermost outer copper foil 36.

Thereby, the heater tip end parts 48a on the upper and lower sides apply heat to the prepreg 32 through the outer copper foils 36 and the inner copper foils 34, and thus the prepreg 32 is melted. The melted prepreg 32 is bonded to the outer copper foils 36 on the upper and lower sides and cured. Hence, desired temporary bonding is completed (i.e., the temporary substrate 30 is completed). Then, the holding guides 44 are moved from the guided positions to the standby positions (box movement).

The metal plate 50 is formed of a material having a favorable thermal conductivity as similar to the table 42. Accordingly, when the temporary bonding is performed, the material allows extra heat to easily escape to the metal plate 50 as in the case of the table 42. As a result, the range of the prepreg 32 melted can be suppressed to the vicinity of a portion where the prepreg 32 is in contact with the heater units 48, making it possible to prevent a portion of the melted prepreg 32 from infiltrating between the outer copper foil 36 and the inner copper foil 34. In this regard, the metal plate 50 also plays a role of "preventing prepreg infiltration."

In the final step (see FIG. 13C), the vertical cylinders 64 (FIG. 8) are driven to lower the two positioning pins 43 from the table 42, and the temporary substrate 30 is taken out.

In the configuration of the illustrated temporary substrate 30, the peripheral portions of the outer copper foils 36 and the prepreg 32 are illustrated as if not being bonded to one another. However, the prepreg 32 is actually bonded to the peripheral portions of the outer copper foils 36 as illustrated in FIG. 1B.

After this step is ended, the temporary substrate 30 is further heated and pressed from both surface sides in a vacuum atmosphere by a laminating press. Thereby, the prepreg 32 is completely cured. Furthermore, both end surfaces of the temporary substrate 30 are straightened by cutting or the like.

The above steps lead to the manufacture of the targeted temporary substrate (support) 30.

As described above, in the apparatus 100 (FIGS. 7 to 9) for and the method (FIGS. 10A to 13C) of manufacturing a temporary substrate according to the embodiment, the temporary bonding is completed while the positions of the constituent members are being fixed and held using the jig 40 (FIGS. 3A and 3B) which includes: the table 42 on which the positioning pins 43 are disposed to fix the positions of the outer copper foils 36; the holding guide 44 (or 52) for guiding the inner copper foils 34 and the prepreg 32 to predetermined positions in the process of manufacturing the temporary substrate 30; the holding unit 46 for holding the laminated inner copper foils 34 and prepreg 32 so that the laminated inner copper foils 34 and prepreg 32 do not move; and the heater unit 48 for performing the temporary bonding on the laminated five layers of the constituent members (36/34/32/34/36).

In this event, each member of the holding guide 44 (52), the holding unit 46 and the heater unit 48 is driven with the drive mechanism exemplified in FIGS. 7 to 9 to move between the standby position (FIG. 3B) and the in-use position (FIG. 3A). In addition, the holding guide 44 (52) has the step portions SP1, SP2 (FIGS. 4A, 4B, and 6) formed in such a manner that the peripheries of the step portions respectively define the areas corresponding to the outer sizes respectively of the inner copper foil 34 and the prepreg 32 when the holding guide 44 (52) is moved to the in-use position.

Thereby, when the inner copper foil 34 is set in the process of manufacturing the temporary substrate 30, the inner copper foil 34 is accurately positioned with the rectangular area (FIGS. 4A and 6) defined by the two (or four) step portions SP1 of the holding guide 44 (52) disposed to face each other. Similarly, when the prepreg 32 is set also, the prepreg 32 is accurately positioned with the rectangular area defined by the two (or four) step portions SP2 of the holding guide 44 (52) disposed to face each other.

Namely, the first step portions SP1 of the holding guide 44 (52) enable accurate positioning of the inner copper foil 34 disposed on the inner layer side of the temporary substrate 30 and having a small outer size. Thereby, in the process of manufacturing a multilayer wiring board using the temporary substrate 30 (see FIGS. 1A to 2C), it becomes possible to minimize the bonded portion in the outer peripheral portion of the temporary substrate, the bonded portion being removed by accurately cutting out at positions corresponding to the periphery of the inner copper foil 34 in the end. In other words, it becomes possible to secure a wide (largest possible) wiring formation area defined inside the bonded portion to be removed.

Incidentally, in the related technique, when the prepreg 12 is bonded to the outer copper foil 16 in manufacturing the temporary substrate 10 (see FIGS. 1A and 1B), it is assumed that a small portion of the melted prepreg 12 may infiltrate between the outer copper foil 16 and the inner copper foil 14. In this case, the inner copper foil 14 is partially bonded to the outer copper foil 16 near the periphery thereof. Accordingly, when the bonded portion in the outer peripheral portion of the temporary substrate 10 is cut out and removed, the cutting has to be performed at a portion slightly inward of the position corresponding to the periphery of the inner copper foil 14. Namely, the bonded portion to be removed is increased by that amount. The largest possible wiring formation area cannot be secured.

In this embodiment, as described in connection with the "temporary bonding" process performed in the step of FIG. 13B, the metal plate 50 plays a role of "preventing prepreg infiltration" and thus effectively prevents a portion of the melted prepreg 32 from infiltrating between the outer copper foil 36 and the inner copper foil 34. This can eliminate such a problem as assumed in the conventional technique that the inner copper foil is partially bonded to the outer copper foil near the periphery thereof. Namely, this can contribute to securing of the largest possible wiring formation area.

The above-described embodiments have been described by taking the example where the inner copper foils 34 and the prepreg 32 are positioned utilizing the step portions SP1, SP2 provided on the holding guide 44 (52). Nevertheless, it is a matter of course that the number of the step portions provided on the holding guide is not necessarily limited to two.

Figure 15A:
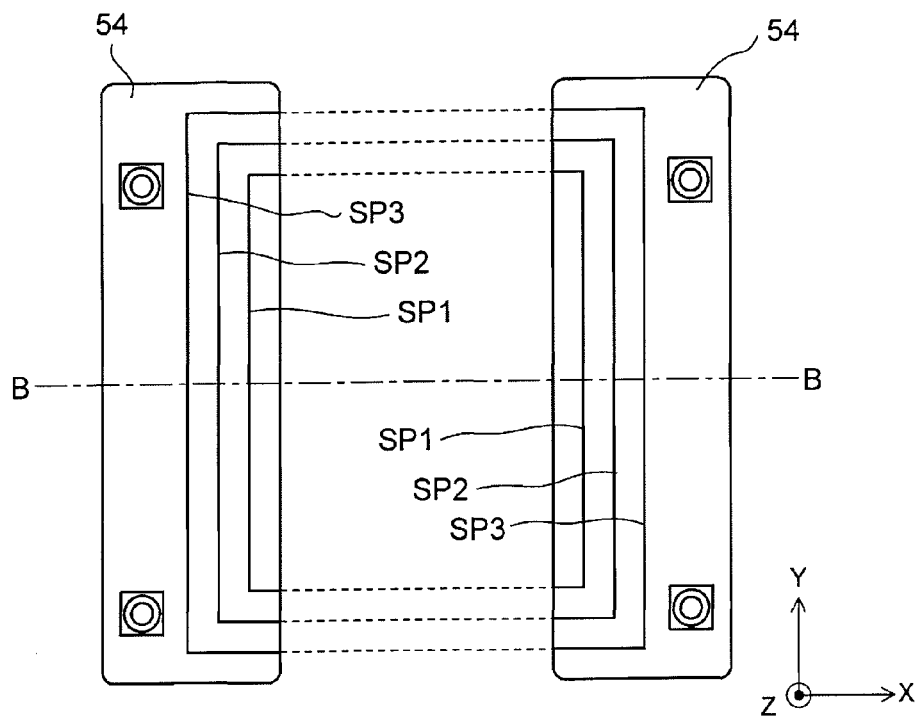
FIGS. 15A and 15B are views illustrating the configuration of a holding guide in another embodiment, FIG. 15A being a plan view thereof, and FIG. 15B being a sectional view taken along the line B-B in FIG. 15A.
Figure 15B:
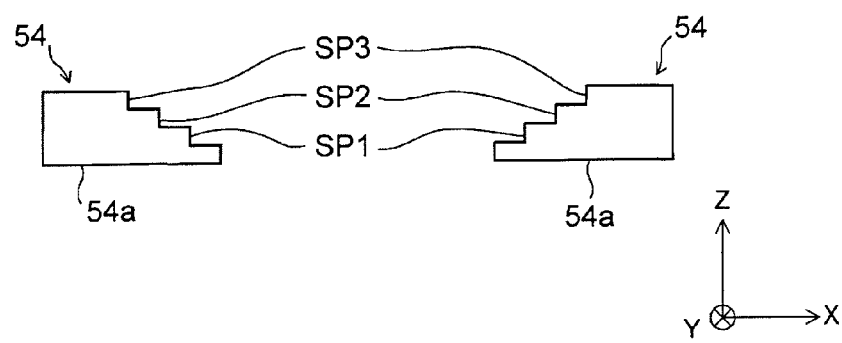

FIGS. 15A and 15B illustrate the configuration of a holding guide in another embodiment. FIG. 15A is a plan view thereof, and FIG. 15B is a sectional view when seen along the line B-B in FIG. 15A. In this embodiment, a holding guide 54 is separated into two parts, and has guide bottom surfaces 54a. The holding guides 54 thus separated are formed to have three step portions SP1, SP2, SP3 (see FIG. 15B) in the sequence from the bottom. The holding guides 54 are disposed to face each other, and portions where the step portions SP1, SP2, SP3 are formed are directed inward. The first step portions SP1 and the second step portions SP2 are the same as those in the above-described embodiments.

This embodiment further includes the third step portions SP3. The third step portions SP3 are formed in such a manner that the peripheries of the step portions SP3 and portions extending from the peripheries (portions indicated by the dotted lines) define a rectangular area in the plan view of the two holding guides 54 disposed to face each other (see FIG. 15A). The third step portions SP3 are used when the outer copper foils 36 each having a larger outer size than the prepreg 32 are set. The outer copper foils 36 are accurately positioned with the rectangular area defined by the two step portions SP3 disposed to face each other. Namely, the size of the rectangular area in this case corresponds to the outer size of the outer copper foils 36.

The third step portions SP3 additionally provided as described above also enable positioning of the outer copper foils 36 with the holding guides 54. Thus, from this embodiment, it is possible to omit the positioning pins 43 disposed on the table 42, the mechanisms such as the vertical cylinder 64 and the operation switch 66 to drive the positioning pins 43, the pin-insertion holes provided in advance in the outer copper foil 36 in the above-described embodiments. Moreover, the alignment mark or the like provided in advance in the second outer copper foil 36 can also be omitted. In this case, similar marking has to be made in the second outer copper foil 36 on this jig by scribing, inkjet, laser, or the like.

Further, the above-described embodiments have been described by taking the example where the manufactured temporary substrate (support) 30 has a five-layer structure in which the inner metal foils 34 and the outer metal foils 36 are stacked on both surfaces of a single layer of the prepreg 32. Nevertheless, a plurality of prepregs 32 may be laminated to improve the strength of a temporary substrate. In this case, a plurality of prepregs 32 can be laminated by repeating the step of stacking the prepreg 32 (FIGS. 11B and 11C) a desired number of times with the apparatus 100 for manufacturing a temporary substrate exemplified in FIGS. 7 to 9. For example, when two prepregs 32 are to be laminated, the constituent members are stacked in the sequence of outer copper foil 36/inner copper foil 34/prepreg 32/prepreg 32/inner copper foil 34/outer copper foil 36.

Furthermore, the above-described embodiments have been described by taking the example where the temporary substrate 30 manufactured with the apparatus for manufacturing a temporary substrate (FIGS. 7 to 9) is employed in manufacturing a wiring board (coreless board) used in a semiconductor package. It is a matter of course, however, that the manufacturing apparatus according to the invention is not limited to the manufacturing of a coreless board. For example, the manufacturing apparatus is also applicable to a manufacturing of an electronic component-incorporating board in which an electronic component such as a semiconductor chip is incorporated in an insulating layer of a wiring board, or a package for electronic component.

Still furthermore, the above-described embodiments have been described by taking the example where each operation is manually performed in the apparatus for manufacturing a temporary substrate (FIGS. 7 to 9). Nevertheless, each member constituting the jig 40 (the holding guide, the holding unit, the heater unit) may be automatically driven. Additionally, each constituent member of the temporary substrate (the outer metal foils, the inner metal foils, and the prepreg) may be automatically supplied into the manufacturing apparatus, in combination with an appropriate conveying mechanism.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An apparatus for manufacturing a temporary substrate, comprising:
    a jig including
        a table for laminating constituent members of the temporary substrate,
        a holding guide for guiding one of the constituent members to a predetermined position,
        a holding unit for holding the laminated constituent members, and
        a heater unit for performing a temporary bonding on the laminated constituent members; and
    a drive mechanism for moving each of the holding guide, the holding unit and the heater unit between a standby position and an in-use position,
    wherein the holding guide has a plurality of step portions formed in such a manner that peripheries of the step portions define areas corresponding to outer sizes of the respective constituent members when the holding guide is moved to the in-use position.

2. The apparatus for manufacturing a temporary substrate, according to claim 1, wherein the temporary substrate has, as the constituent members:
    a prepreg;
    inner metal foils respectively stacked on both surfaces of the prepreg and each having a smaller outer size than the prepreg; and
    outer metal foils respectively stacked on the inner metal foils and each having a larger outer size than the prepreg.

3. The apparatus for manufacturing a temporary substrate, according to claim 2, wherein the plurality of step portions provided on the holding guide include a first step portion corresponding to the outer size of the inner metal foil, a second step portion corresponding to an outer size of the prepreg, and a third step portion corresponding to the outer size of the outer metal foil.

4. The apparatus for manufacturing a temporary substrate, according to claim 2, further comprising a plurality of positioning pins for fixing positions of the stacked outer metal foils, the positioning pins being disposed at positions near a periphery of the table, and the positioning pins being provided in such a manner as to protrude from top of the table during use.

5. The apparatus for manufacturing a temporary substrate, according to claim 4, further comprising a plate-shaped member placed on the outer metal foil stacked as an uppermost layer before the temporary bonding is performed using the heater unit.

6. The apparatus for manufacturing a temporary substrate, according to claim 5, wherein the plate-shaped member and the table are both formed of a material having a good thermal conductivity.

* * * * *